United States Patent [19]

Shiga

[11] Patent Number: 5,180,996
[45] Date of Patent: Jan. 19, 1993

[54] HIGH FREQUENCY OSCILLATOR HAVING CAPACITOR AND MICROSTRIP LINE OUTPUT FILTER

[75] Inventor: Nobuo Shiga, Yokohama, Japan

[73] Assignee: Sumitomo Electric Industries, Ltd., Japan

[21] Appl. No.: 791,739

[22] Filed: Nov. 15, 1991

[30] Foreign Application Priority Data

Nov. 16, 1990 [JP] Japan .................. 2-311060

[51] Int. Cl.$^5$ .................................. H03B 5/18
[52] U.S. Cl. .................................. 331/77; 331/99; 331/117 D; 331/117 FE; 333/204
[58] Field of Search .................. 331/74, 77, 96, 99, 331/117 D, 107 SL, 117 FE; 333/204, 205, 238, 246, 347; 330/286, 287, 53

[56] References Cited

U.S. PATENT DOCUMENTS 4,707,669 11/1987 Mekata et al. .................. 331/99

FOREIGN PATENT DOCUMENTS 202652 11/1986 European Pat. Off. .

OTHER PUBLICATIONS

Philip G. Wilson et al., "An Easy-To-Use FET DRO Design Procedure suited to Most CAD Programs", 1989 IEEE MTT-S Digest, pp. 1033-1036.

Primary Examiner—Siegfried H. Grimm
Attorney, Agent, or Firm—Beveridge, DeGrandi & Weilacher

[57] ABSTRACT

This invention relates to a high-frequency oscillator constituted by a signal generator for generating a high-frequency signal and a signal output circuit for outputting the generated high-frequency signal. The signal output circuit comprises a capacitor having one terminal to which the high-frequency signal output from the signal generator is applied, and a microstrip line having one terminal, which is connected to the other terminal of the capacitor, and the other terminal set at a reference potential. This signal output circuit can be miniaturized compared with those constituted only by microstrip lines such as conventional signal output circuits. By properly setting the capacitance of the capacitor and the size of the microstrip line, a filter function can also be imparted to the circuit.

2 Claims, 5 Drawing Sheets

HIGH FREQUENCY OSCILLATOR HAVING CAPACITOR AND MICROSTRIP LINE OUTPUT FILTER

BACKGROUND OF THE INVENTION

1. Field of the Invention

The present invention relates to a high-frequency oscillator for use in, e.g., a receiving circuit of a satellite communication system.

2. Related Background Art

As a conventional example of a high-frequency oscillator of this type, there is the one described in a paper titled "AN EASY-TO-USE FET DRO DESIGN PROCEDURE SUITED TO MOST CAD PROGRAMS", 1989 IEEE MTT-S Digest, PP. 1,033–1,036. The arrangement of this high-frequency oscillator is diagrammed in FIG. 1.

A DRO (an oscillator using a dielectric resonator; Dielectric Resonator Oscillator) shown in FIG. 1 employs a MESFET (Schottky barrier field-effect transistor) Q1 as an amplifying element. A voltage Vd is applied to the drain of the FET Q1 through microstrip lines 1 to 4, and a voltage Vs is applied to its source through microstrip lines 5 to 8. A dielectric resonator is electromagnetically coupled to microstrip lines 9 and 10 on the gate, and this coupling circuit is expressed as a parallel circuit of L, C, and R. A high-frequency signal which appears at the drain of the MESFET Q1 is output through microstrip lines 11 to 14. The lines 13 and 14 constitute a capacitor, and a load resistor $R_L$ is connected to the line 14.

As described above, the signal output circuit in this conventional high-frequency oscillator has the microstrip lines 11 to 14 as its constituting elements. Accordingly, an area on a semiconductor substrate physically occupied by these lines 11 to 14 is increased to result in a large size of the oscillator as a whole. In addition, the signal output circuit having the above conventional arrangement has only a function of obtaining impedance matching. Therefore, it is impossible to allow the circuit to have, for example, a filter function of inhibiting transmission of signals having specific signal frequency components.

SUMMARY OF THE INVENTION

It is the first object of the present invention to miniaturize a high-frequency oscillator.

It is the second object of the present invention to make it possible to impart a filter function to a signal output circuit in a high-frequency oscillator.

In order to achieve the above objects, a signal output circuit of a high-frequency oscillator according to the present invention comprises a capacitor having one terminal to which a high-frequency signal output from a signal generator is applied, and a microstrip line having one terminal, which is connected to the other terminal of the capacitor, and the other terminal set at a reference potential. This arrangement is much smaller than arrangements constituted only by microstrip lines such as conventional arrangements.

In addition, by setting the capacitance of the capacitor to be a predetermined value and the shape of the microstrip lines to be a predetermined shape, the value of an $S_{21}$ parameter of the signal output circuit reduces at a predetermined frequency. Therefore, the signal output circuit can have a filter function in addition to an impedance matching function.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
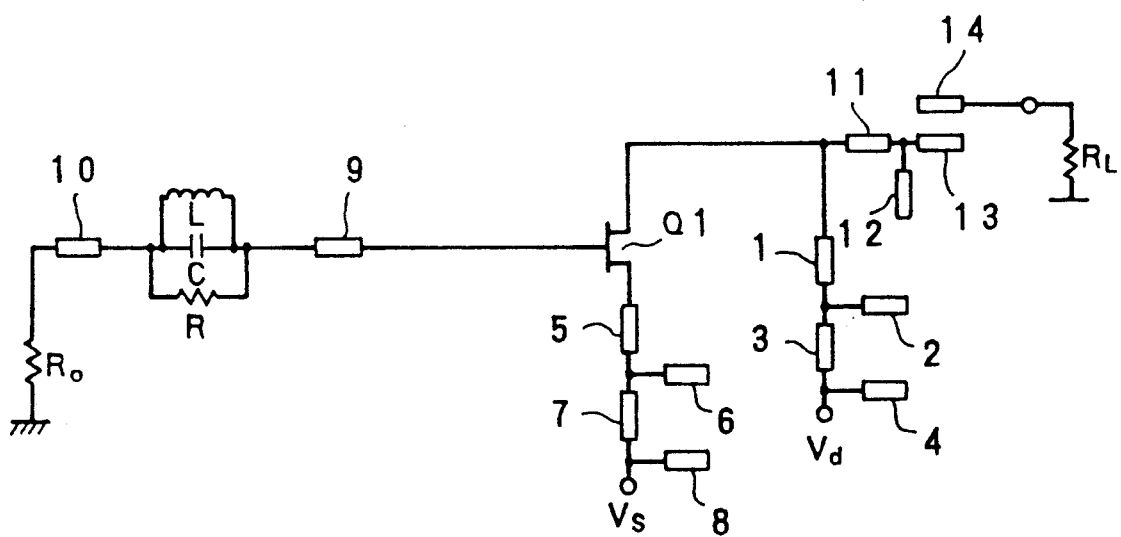
FIG. 1 is an equivalent circuit diagram of a high-frequency oscillator obtained when a conventional high-frequency oscillator is patterned on a semiconductor substrate.

A case wherein a high-frequency oscillator according to an embodiment of the present invention is applied to a BS (Broadcasting Satellite) converter will be described below. The high-frequency oscillator of this embodiment has an oscillation frequency $f_{LO}$ of 10.7 GHz and formed on a GaAs (gallium arsenide) semiconductor substrate 100 μm in thickness. The circuit arrangement of this oscillator is identical to that of a conventional oscillator shown in FIG. 1 except for the arrangement of a signal output circuit. For this reason, the high-frequency oscillator according to this embodiment will be described below only in relation to this signal output circuit. FIG. 2 illustrates the signal output circuit of this embodiment, which is patterned on a GaAs semiconductor substrate.

The signal output circuit is composed of a capacitor 21 and microstrip lines 22 and 23. One terminal of the capacitor 21 is connected to a terminal 24 which is connected to the drain of a MESFET Q1 (see FIG. 1). A high-frequency signal which appears at this drain is applied to the above-mentioned terminal of the capacitor 21 via the terminal 24. The other terminal of the capacitor 21 is connected to one terminal of a microstrip line 22, the other terminal of which is set at a ground potential. A node between the capacitor 21 and the microstrip line 22 is connected to an external terminal 25 of the signal output circuit through a microstrip line 23. The external terminal 25 is connected to a load 26 of 50 Ω.

Note that the microstrip line 23 is wiring for extracting the node between the capacitor 21 and the microstrip line 22 outside the circuit and is not an element which positively constitutes the signal output circuit. By setting the characteristic impedance of this microstrip line to be 50 Ω which is equal to the load impedance, it becomes unnecessary to use the line 23 as a constituting element of the circuit. Therefore, the circuit design will be described below assuming that the line 23 is omitted from the circuit.

The capacitance of the capacitor 21 and the shape of the microstrip line 22 are designed such that an impedance Z in a direction from the terminal 24 as the input terminal of the signal output circuit to the load becomes a predetermined load impedance, i.e., 50 Ω. Suppose that an impedance $Z_{out}$ in a direction from the terminal 24 to a signal generator is −150 Ω which satisfies predetermined oscillation conditions of the signal generator. More specifically, the capacitance of the capacitor 21 and the shape of the microstrip line 22 can be designed in the following two ways in accordance with the function imparted to the signal output circuit. Note that determination of this design condition is performed by assuming that the capacitor 21 and the microstrip line 22 have various capacitances and shapes, respectively, and calculating, e.g., the frequency characteristic of each S parameter on the basis of each assumption using a computer.

First, in order to allow the signal output circuit to have both the impedance matching function and the filter function, a capacitance C of the capacitor 21 is set to be 1.2 pF, and a line width W1 and a line length l1 of the microstrip line 22, 10 μm and 2,520 μm, respectively. This design condition will be referred to as design condition 1 hereinafter. Second, in order to impart only the impedance matching function to the signal output circuit and to decrease particularly the circuit size, the capacitance C of the capacitor 21 is set to be 0.9 pF, and the line width W1 and the line length l1 of the microstrip line 22, 10 μm and 870 μm, respectively. This design condition will be referred to as design condition 2 hereinafter.

If the signal output circuit having the above arrangement is considered to be a four-terminal circuit, the frequency characteristics of the respective S parameters are as follows. That is, the frequency characteristics of $S_{21}$ and $S_{11}$ parameters under the design condition 1 are graphically illustrated in FIG. 3. In this case, the $S_{21}$ parameter represents a forward transmission coefficient, i.e., a signal passing characteristic when impedances are matched on the external terminal 25 of the signal output circuit. The $S_{11}$ parameter represents a reflection coefficient indicating the manners of a travelling wave and a reflected wave at the input terminal 24, obtained when impedances are matched on the external terminal 25.

Figure 3:
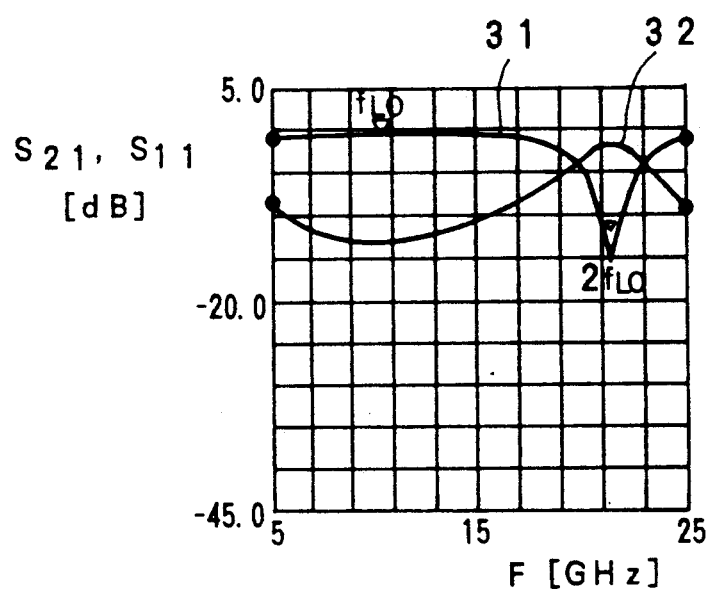
FIG. 3 is a graph showing the frequency characteristics of $S_{21}$ and $S_{11}$ parameters obtained when each element of the signal output circuit is set in design condition 1.

In FIG. 3, the abscissa indicates a frequency [GHz], and the ordinate, an attenuation amount [dB]. The frequency characteristics of the $S_{21}$ and $S_{11}$ parameters are indicated by curves 31 and 32, respectively. A point indicated by symbol ▽ on the characteristic curve 31 represents a design point as a target in this circuit design. As is understood from FIG. 3, on the curve 31, a signal is largely attenuated at a frequency $2f_{LO}$ (=21.4 GHz) which is twice the oscillation frequency $f_{LO}$ (=10.7 GHz). This means that the signal output circuit inhibits propagation of signal components having a double frequency of the oscillation frequency. That is, the signal output circuit functions as a filter. This phenomenon also appears in the characteristic of the $S_{11}$ parameter. That is, as is understood from the curve 32, the $S_{11}$ parameter is small near the frequency $f_{LO}$, and, in this case, there is little reflection of a travelling wave at the terminal 24. Near $2f_{LO}$, i.e., a double frequency, however, the $S_{11}$ parameter increases, and this results in an increase in reflection of the travelling wave at the input terminal 24.

Figure 4:
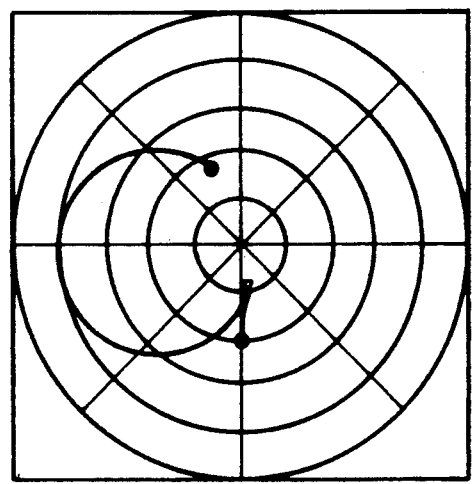
FIG. 4 is a graph showing the frequency characteristic of the $S_{11}$ parameter on a Smith chart obtained when each element of the signal output circuit is set in the design condition 1.

FIG. 4 illustrates changes in frequencies of 5 to 25 GHz of the $S_{11}$ parameter on a Smith chart. Here, again, a point indicated by symbol ▽ on a characteristic curve represents a design point as a target in this circuit design. As is understood from FIG. 4, when the frequency is near $2f_{LO}$, a double frequency, an arc representing the frequency characteristic is close to the outermost circumference of the Smith chart, and the absolute value of the $S_{11}$ parameter is large.

Figure 5:
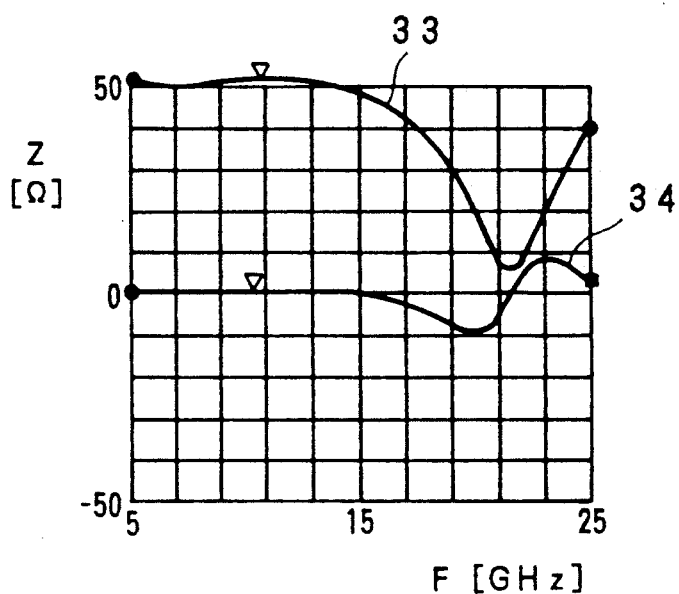
FIG. 5 is a graph showing the frequency characteristic of an impedance Z in a direction from an input terminal to a load obtained when each element of the signal output circuit is set in the design condition 1.

FIG. 5 shows the frequency characteristic of the impedance Z in a direction from the input terminal 24 to the load obtained when a load 26 is connected to the external terminal 25 of the signal output circuit. In FIG. 5, the abscissa indicates a frequency [GHz], and the ordinate, a resistance [Ω]. In addition, a curve 33 represents the frequency characteristic of the real number part of the impedance Z, and a curve 34, that of its imaginary number part. Here, again, points indicated by symbol ▽ on the characteristic curves 33 and 34 represent design points as targets in this circuit design. When the frequency is 15 GHz or less, since the real number part is about 50 Ω while the imaginary number part is 0, the impedance Z is regarded as a pure resistor of 50 Ω. Therefore, it is identified from FIG. 5 that the impedance Z in the direction from the input terminal 24 to the load is 50 Ω at the oscillation frequency of 10.7 GHz.

Figure 6:
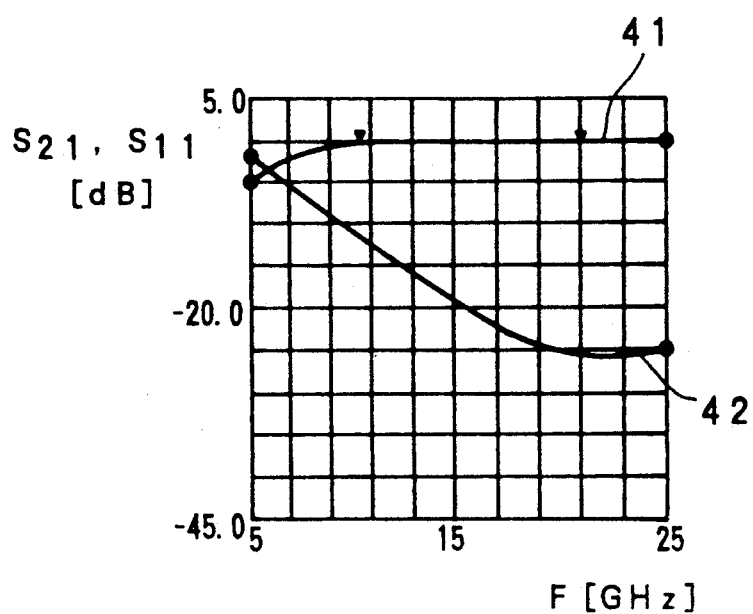
FIG. 6 is a graph showing the frequency characteristics of the $S_{21}$ and $S_{11}$ parameters obtained when each element of the signal output circuit is set in design condition 2.
Figure 7:
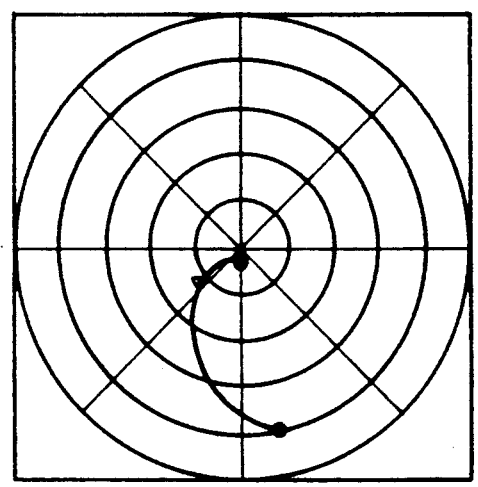
FIG. 7 is a graph showing the frequency characteristic of the $S_{11}$ parameter on a Smith chart obtained when each element of the signal output circuit is set in the design condition 2.
Figure 8:
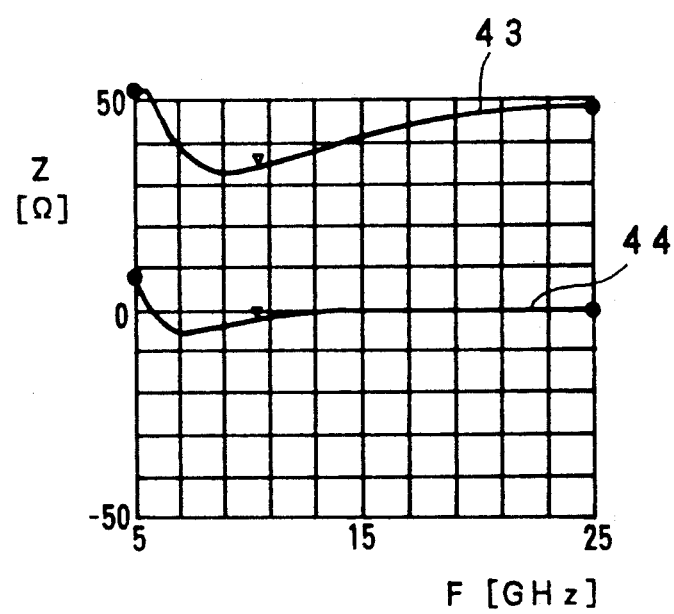
FIG. 8 is a graph showing the frequency characteristic of the impedance Z in the direction from the input terminal to the load obtained when each element of the signal output circuit is set in the design condition 2.

FIG. 6 shows the frequency characteristics of the $S_{21}$ and $S_{11}$ parameters of the signal output circuit obtained under the design condition 2, FIG. 7, the frequency characteristic of the $S_{11}$ parameter on a Smith chart under the same condition, and FIG. 8, the frequency characteristic of the impedance Z under the same condition. The graphs shown in FIGS. 6 to 8 correspond to those of FIGS. 3 to 5, respectively. Therefore, the abscissa and ordinate in each graph have the same meanings as in the corresponding graph and a detailed description thereof will be omitted.

Referring to FIG. 6, curves 41 and 42 indicate the frequency characteristics of the $S_{21}$ and $S_{11}$ parameters, respectively. As is understood from the curve 41, the $S_{21}$ parameter remains substantially constant regardless of the frequency change. In contrast, as is understood from the curve 42, the $S_{11}$ parameter decreases as the frequency increases. In addition, it is understood from FIG. 7 that the $S_{11}$ parameter approaches the center of the Smith chart and therefore its absolute value decreases as the signal frequency increases from 5 to 25 GHz. From these facts, it is understood that the signal output circuit under the design condition 2 has no filter function. That is, unlike the signal output circuit under the design condition 1, a reflection amount of the signal at the input terminal 24 is minimized near the double frequency, which means that transmission of signal components having the double frequency is not inhibited.

Referring to FIG. 8, curves 43 and 44 indicate the frequency characteristics of the real and imaginary parts, respectively, of the impedance Z. It is understood that the impedance Z is set at substantially 50 Ω at a design point indicated by symbol ▽.

A pattern area occupied by each signal output circuit having the above frequency characteristics on a semiconductor substrate is as follows. First, the physical sizes of the capacitor 21 on the semiconductor substrate under the design conditions 1 and 2 will be described. Assuming that the capacitor 21 is constituted by an MIN (metal-insulator-metal) capacitor, an area occupied on the substrate by the capacitor 21 having a capacitance of 1.2 pF according to the design condition 1 is $64 \times 84$ $\mu m^2$. Similarly, an area occupied on the substrate by the capacitor 21 having a capacitance of 0.9 pF according to the design condition 2 is $64 \times 64$ $\mu m^2$. The size of the microstrip line 22 is $10 \times 2,520$ $\mu m^2$ in the case of the design condition 1 and $10 \times 870$ $\mu m^2$ in the case of the design condition 2.

Accordingly, the pattern area of the signal output circuit under the design condition 1 is 30,576 ($= 64 \times 84 + 10 \times 2,520$) $\mu m^2$, while that under the design condition 2 is 12,796 ($= 64 \times 64 + 10 \times 870$) $\mu m^2$. That is, the size of the signal output circuit according to the design condition 2 is smaller than that of the signal output circuit according to the design condition 1, because the circuit according to the design condition 2 has no filter function.

Figure 2:
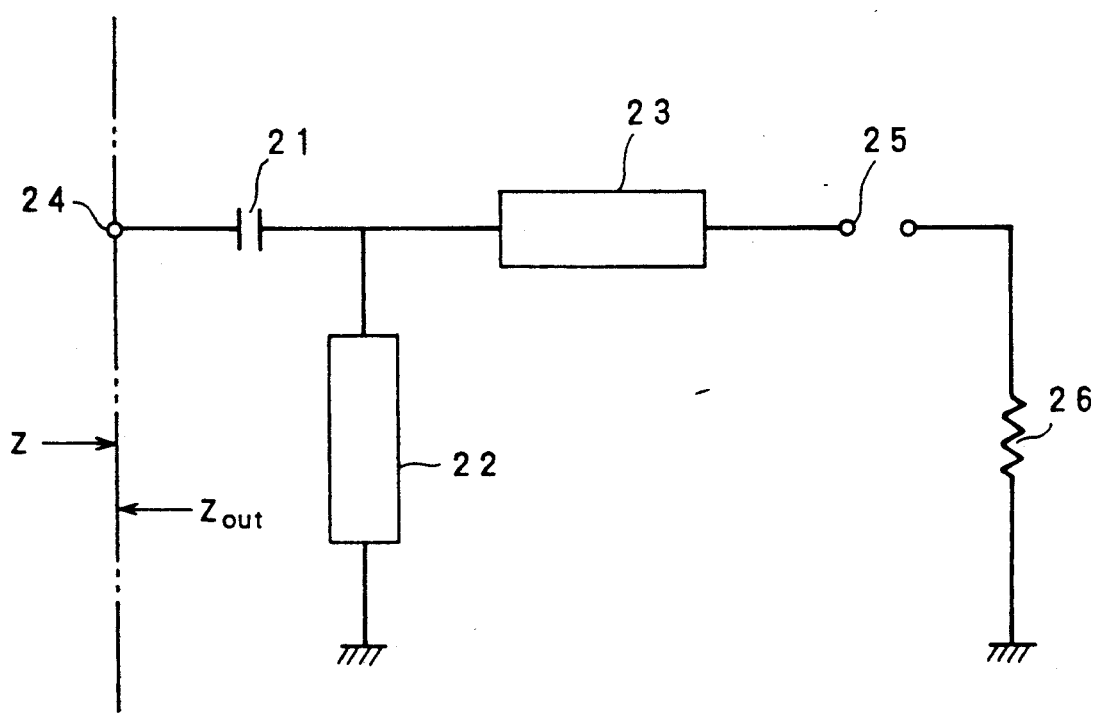
FIG. 2 is an equivalent circuit diagram of a signal output circuit obtained when a high-frequency oscillator according to one embodiment of the present invention is patterned on a semiconductor substrate.

Both the signal output circuits according to the design conditions 1 and 2, however, are sufficiently miniaturized compared with the conventional signal output circuit illustrated in FIG. 1. That is, the pattern areas of the microstrip lines 11 to 14 constituting the conventional signal output circuit are: the line 11, $3 \times 2,573$ $\mu m^2$ (line width $W = 3$ $\mu m$, line length $L = 2,573$ $\mu m$); the line 12, $100 \times 1,018$ $\mu m^2$ (line width $W = 100$ $\mu m$, line length $L = 1,018$ $\mu m$); and each of the lines 13 and 14, $3 \times 2,096$ $\mu m^2$ (line width 3 $\mu m$, line length $L = 2,096$ $\mu m$).

The pattern area, therefore, of this conventional signal output circuit is 122,095 $\mu m^2$. This value is much larger than either the pattern area of 30,576 $\mu m^2$ under the design condition 1 or the pattern area of 12,796 $\mu m^2$ under the design condition 2, both according to this embodiment. That is, it is understood that the signal output circuit according to this embodiment is satisfactorily miniaturized.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A high-frequency oscillator comprising:
   a signal generator for generating a high-frequency signal; and
   a signal output circuit, connected to said signal generator, for outputting a high-frequency signal generated by said signal generator, said output circuit having a capacitor and a microstrip line,
   one end of said microstrip line being directly connected with one terminal of said capacitor, the other end of said microstrip line being connected to a reference potential, and the other terminal of said capacitor being connected with an output terminal of said signal generator, whereby said oscillator performs signal matching between said signal generator and said signal output circuit and prevents propagation of signal components having double the frequency of an oscillating frequency generated by said signal generator.

2. An oscillator according to claim 1, wherein said capacitor is a metal-insulator-metal capacitor.

* * * * *